United States Patent
Bozanic et al.

[11] 4,219,775
[45] Aug. 26, 1980

[54] ELECTRON SPIN ECHO SYSTEM HAVING MAGNETIC FIELD SHIFT DURING GENERATION OF THE ECHO SIGNAL

[75] Inventors: Donald A. Bozanic; Dickron Mergerian, both of Baltimore; Ronald W. Minarik, Lutherville, all of Md.

[73] Assignee: Westinghouse Electric Corp., Pittsburgh, Pa.

[21] Appl. No.: 832,101

[22] Filed: Jun. 11, 1969

[51] Int. Cl.² .......................................... G01R 23/02
[52] U.S. Cl. .................................. 324/313; 324/310; 343/18 E
[58] Field of Search .................. 324/0.5, 0.5 R, 0.5 A, 324/0.5 NF, 0.5 P, 0.5 E; 343/18 E; 333/83

[56] References Cited
U.S. PATENT DOCUMENTS

| | | | |
|---|---|---|---|
| 3,075,156 | 1/1963 | Anderson et al. | 324/0.5 X |
| 3,108,275 | 10/1963 | Chisholm | 343/18 |
| 3,226,714 | 12/1965 | Applegarth | 343/6.8 |
| 3,277,476 | 10/1966 | Sabin et al. | 343/18 |

Primary Examiner—Nelson Moskowitz
Attorney, Agent, or Firm—W. E. Zitelli

[57] ABSTRACT

A method and means of generating an electron spin echo signal having a relatively higher output frequency than the input frequency of the applied 90° and 180° RF pulses applied to an electron spin echo sample located in a static magnetic field by increasing the magnitude of the Zeeman magnetic field by a predetermined amount after the application of the 90° and 180° pulses. Also the spin echo sample is situated in a microwave cavity which has two resonant frequency modes, the first of which has a relatively high Q while the second has a relatively low Q. The 90° and 180° RF pulses are applied to the system at the first resonant frequency having the high Q while the spin echo signal is coupled out of the system at the second resonant frequency having the low Q.

9 Claims, 9 Drawing Figures

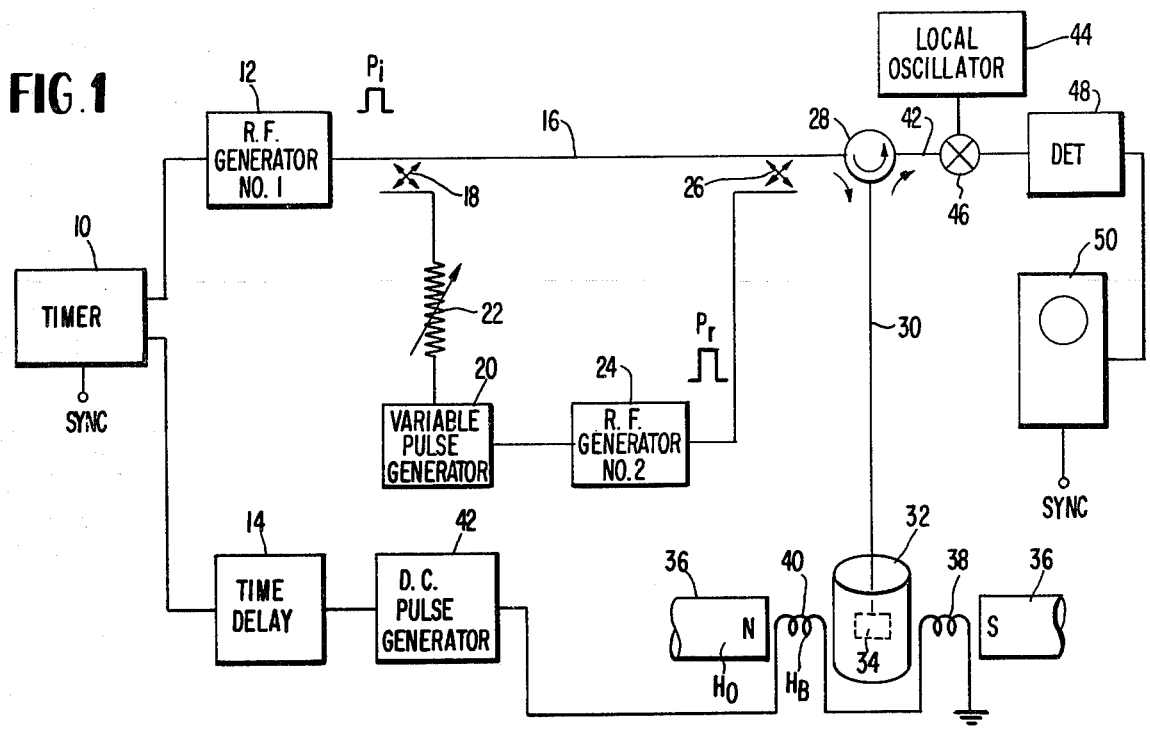
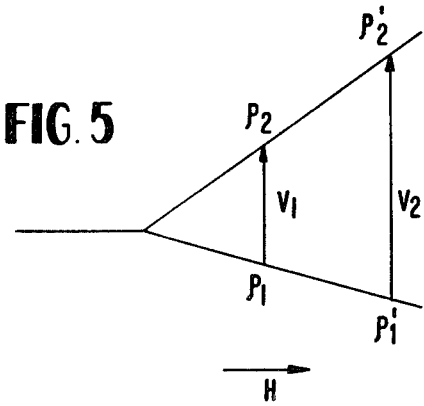
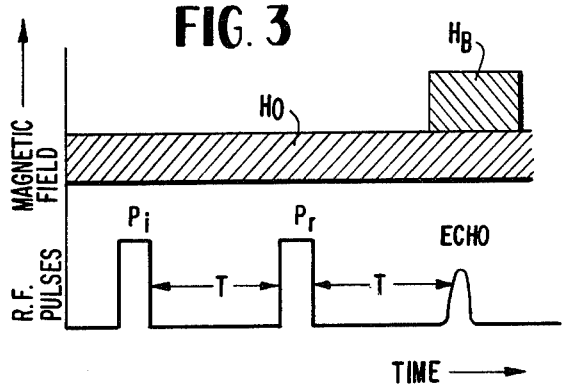
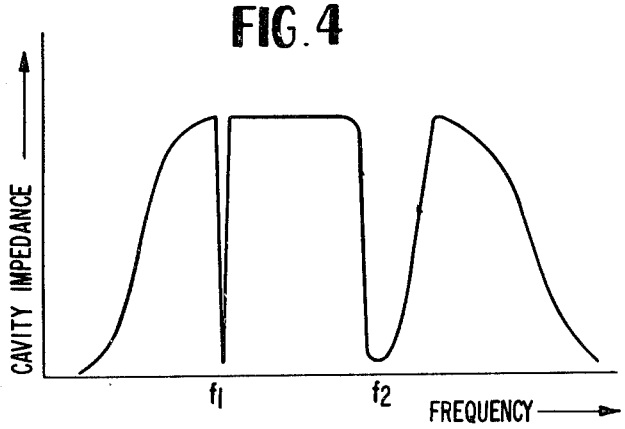

ELECTRON SPIN ECHO SYSTEM HAVING MAGNETIC FIELD SHIFT DURING GENERATION OF THE ECHO SIGNAL

BACKGROUND OF THE INVENTION

1. Field of the Invention

Pulsed nuclear induction spin echo techniques are generally well known, having been shown and described for example in U.S. Pat. No. 2,887,673 issued to E. L. Hahn and U.S. Pat. No. Re. 23,950 granted to F. Bloch, et al. These patents indicate that if a paramagnetic substance is located in a strong uniform magnetic field for a sufficient period of time so as to be in thermal equilibrium, the resultant magnetic moment present in the material is aligned in the direction of the field. If an RF field or "90°" pulse having a frequency equal to the charateristic or Larmor frequency of the substance is applied at right angles to the field, a torque is applied to the magnetic moment which causes it to be tipped or turned away from the direction of the field. The angle of tipping, that is the angle between the moment and the direction of the field, is proportional to the magnitude of the field and the time during which the pulse is applied. Upon release of the displacing force, the spinning nuclei urged toward realignment by the force of the magnetic field, now rotate or precess about the field in much the same manner as a tipped gyroscope. Another RF field or "180°" pulse is then applied to the sample, also at right angles to the field. After a time equal to the time interval between the occurrence of the 90° and 180° pulses, the sample develops spontaneously a magnetic field of its own which is also normal to the magnetic field and which rotates around the latter's direction. The strength of this rotating field builds up to a maximum and then decays and is picked up inductively as a "spin echo" signal.

Recent advances in the art have been directed to electron spin systems which operate in the microwave range. The difference between electron and nuclear spin systems is due to the difference in the mass of the electron as opposed to that of the proton. Accordingly, the precessional frequency of the spinning electron is much, much higher as compared to the proton. As such the 90° and 180° pulse is applied to an electron spin echo system in the form of microwave pulses having a carrier frequency in the range of the Larmor frequencies of the electrons present in the sample.

2. Description of the Prior Art

There are many examples of spin echo memory techniques and apparatus wherein additional or supplementary magnetic fields are introduced into the sample in addition to the unidirectional static magnetic field for either regulating or introducing additional field inhomogeneity for the purposes desired. Such an example is U.S. Pat. No. 2,714,714 issued to A. G. Anderson, et al. which teaches a selective method of eliminating noise and interference due to the presence of unwanted storage in a memory sequence, removing unwanted effects while preserving the desired echo signals in their purest and hence the most effective state and further provides for selective read out or destruction of "stimulated" and "mirror" spin echo signals.

Also U.S. Pat. No. 3,072,890 granted to W. V. Smith, et al. describes an electron spin echo storage system utilizing a dual mode low Q microwave cavity which contains a sample material having a suitable spin system and on which an external magnetic field is applied. The input pulses to the system are applied in the $TE_{012}$ mode and the spin echo signal is coupled out in the $TE_{021}$ mode. While the input and output modes are substantially isolated from each other, they both exhibit a relatively broad bandpass or low Q value and furthermore operate at the same resonant frequency.

While the above noted prior art apparatus operate satisfactorily, they do not envision the concept contemplated by the subject invention wherein an echo signal of a different frequency from that of the applied microwave pulses is obtained.

SUMMARY

Briefly, the subject invention comprises the method and apparatus for shifting the frequency of a spin echo signal produced from a pair of successive microwave input pulses applied to a sample of paramagnetic material located in a dual fequency mode cavity having both a first resonant frequency and a high Q for the introduction of the pair of successive microwave pulses and a second resonant frequency and a low Q at a predetermined higher frequency for the coupling out of the spin echo signal. The increase in the frequency of the spin echo signal is produced by an increase by a predetermined magnitude of the Zeeman magnetic field applied to the sample after the application of the pair of microwave input pulses. The increase in the magnetic field effects a shift in the Larmor frequency of the paramagnetic material to the second resonant frequency mode of the cavity which additionally permits observation of the echo signal in absence of the 90° and 180° pulses and avoids saturation effects in IF amplifiers when superheterodyne detection is used to observe the echo.

BRIEF DESCRIPTION OF THE DRAWINGS

FIG. 1 is a block diagram of a first embodiment of apparatus for practicing the subject invention;

FIG. 3 is a diagram illustrative of waveforms depicted for purposes of illustrating the operation of the subject invention;

FIG. 4 is a diagram illustrative of the frequency response of a dual resonant frequency mode cavity in accordance with the teachings of the subject invention;

FIG. 5 is an illustrative diagram of the Zeeman splitting of the electron spins in response to a magnetic field;

DESCRIPTION OF THE PREFERRED EMBODIMENTS

Figure 6:
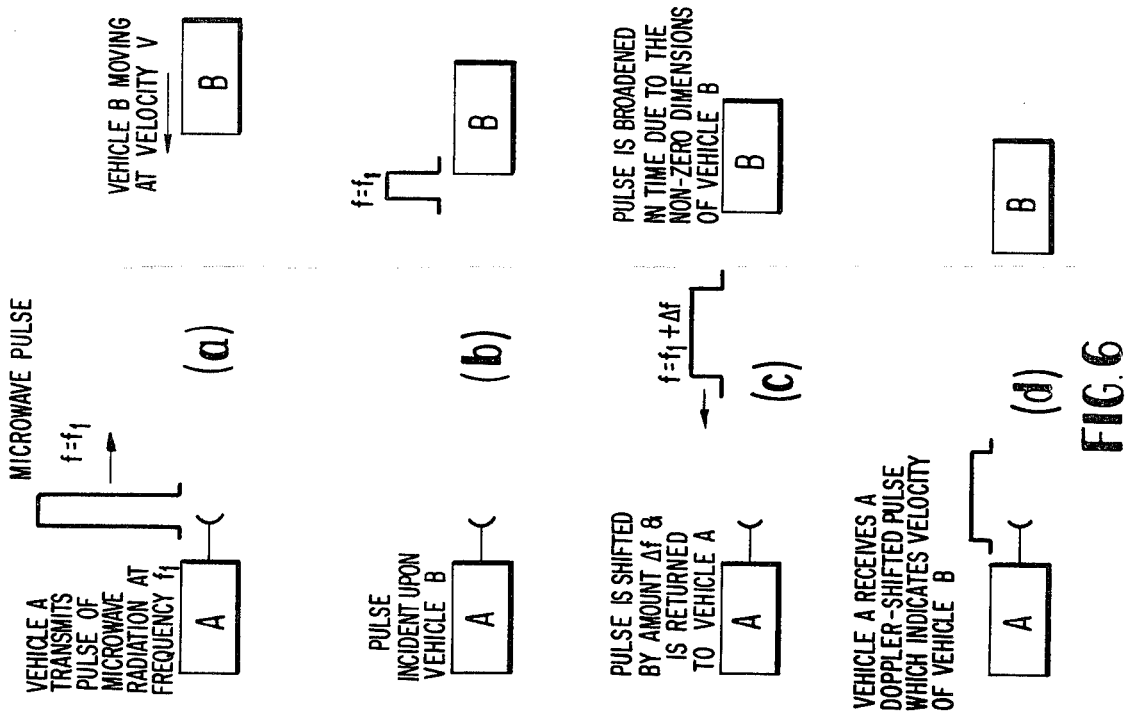
FIGS. 6(a)–6(d) are illustrative respresentations of the Doppler shift of a radar pulse from a moving target.

Referring to the drawings wherein like numerals refer to like parts, attention is called to FIG. 1 which discloses one embodiment of the subject invention. Reference numeral 10 designates a master synchronizer or timer circuit 10 coupled to a first RF generator 12 and a time delay circuit 14. The timer circuit 10 couples a control signal to the RF generator 12 which produces a microwave pulse output $P_i$ which comprises the first of two successive microwave pulses separated by a time interval T which is necessary for producing an electron spin echo signal. A portion of the pulse $P_i$ is coupled from the waveguide circuit 16 into a directional coupler 18 which feeds a portion of this signal to a variable pulse generator 20 through a variable attenuator 22. The variable pulse generator 20 generates a control signal or trigger which when applied to a second RF generator 24 produces a second microwave frequency pulse $P_r$ which is then coupled back to the waveguide circuit 16 by means of the directional coupler 26. The two microwave pulses $P_i$ and $P_r$ correspond to the pulses commonly referred to as the 90° and 180° pulse inputs applied to a spin echo sample which is located in a static unidirectional magnetic field which is directed substantially at right angles to the application of the input pulses.

Figure 2:
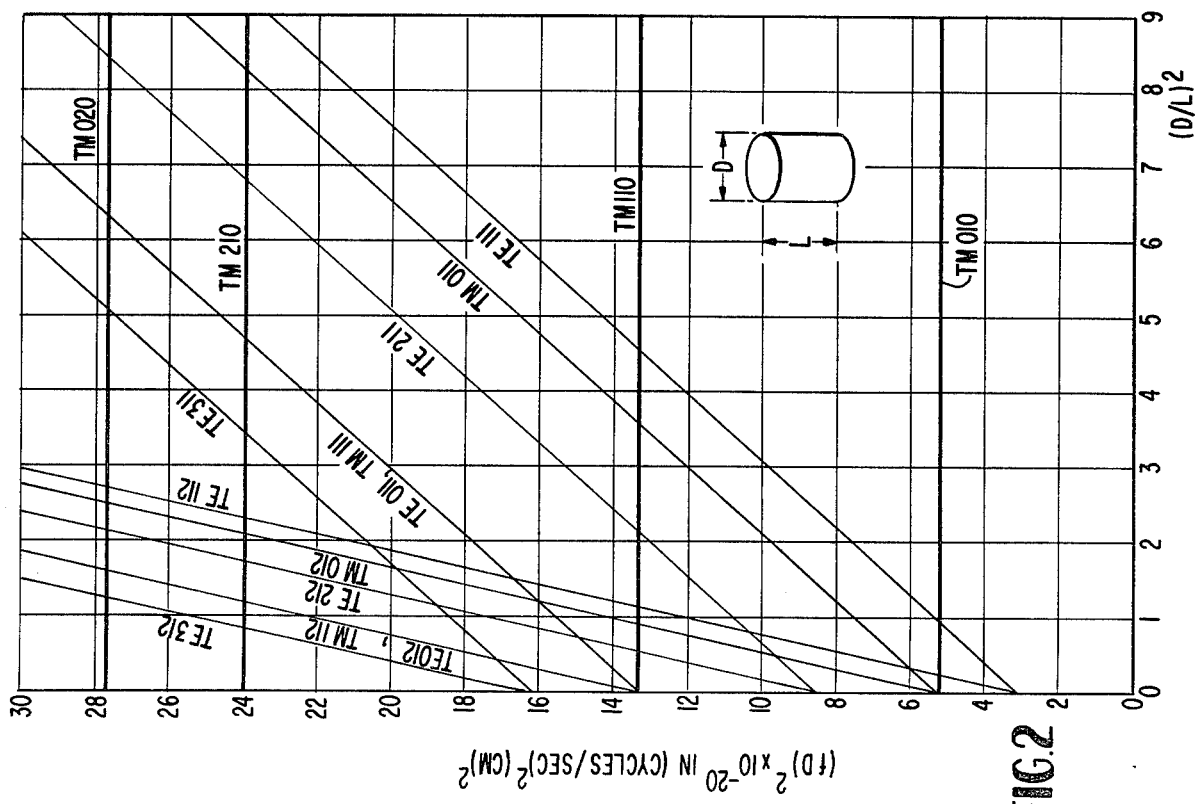
FIG. 2 is an illustration of a typical mode chart for a right circular cylindrical microwave cavity.

Accordingly, the microwave pulses $P_i$ and $P_r$ are coupled from the waveguide circuit 16 into the circulator 28 which transfers these pulses to an adjacent port coupled to the waveguide circuit 30. The waveguide circuit 30 is coupled into a right circular cylinder 32 fabricated of metal and having selected physical dimensions for operating as a microwave resonant cavity having at least two resonant frequency modes separated by a predetermined frequency separation. While a cylindrical cavity is shown for purposes of illustration, it is not intended to be interpreted in a limiting sense since it is within the purview of one skilled in the art that a cavity having any other physical configuration may be resorted to when desirable. Secondly, the design of a microwave cavity having more than one resonant mode is well known to those skilled in the art. For example, FIG. 2 is illustrative of a typical mode chart for a right circular cylindrical cavity having a length L and a diameter of D. By referring to the mode chart as shown in FIG. 2, the physical dimensions of the cavity will be dictated by the resonant frequencies selected. Additional detail as to the design procedure can be found by reference to the text entitled *Reference Data for Radio Engineers*, Fourth edition, Federal Telphone and Radio Corporation, January, 1957, at pages 635–639.

Additionally, the cylindrical waveguide cavity 32 is designed to exhibit a high Q at the first resonant frequency mode while the second resonant frequency mode exhibits a relatively low Q. Such a frequency response is shown for example in the cavity impedance vs. frequency diagram shown in FIG. 4. The purpose of the high Q resonant mode is for obtaining a high coupling factor for the microwave pulses $P_i$ and $P_r$ into the cavity 32 at their lowest possible amplitude level. The second resonant mode, however, has a relatively lower value of Q in order to more efficiently couple power out of the cavity 32. Referring again to the embodiment shown in FIG. 1, an electron spin echo sample 34 is positioned inside of the dual frequency mode cavity 32 between a static unidirectional magnetic field $H_o$ established by means of the permanent magnet 36. A second unidirectional reinforcing field $H_b$ is selectively and intermittently applied through the sample 34 by means of the electromagnetic coils 38 and 40 which are energized in a manner to be described subsequently by means of the pulse generator 42 coupled to the time delay circuit 14.

The embodiment shown in FIG. 1 depends on its operation on the dual resonant frequency modes of the microwave cavity 32 as shown by the response curve in FIG. 4 as well as the application of the additional magnetic field $H_b$ in timed relationship with the generation of a spin echo signal by means of the application of the microwave pulses $P_i$ and $P_r$ into the cavity 32. Assuming for sake of illustration that the cavity 32 exhibits a high Q at a resonant frequency of $f_1$ and that this frequency corresponds to the Larmor frequency of the sample 34 when subjected to the static field $H_o$, upon application of the 90° and 180° pulses $P_i$ and $P_r$ a spin echo signal will be produced substantially at the frequency $f_1$ after a time equal to the time interval between the pulses $P_i$ and $P_r$. The subject invention, however, contemplates applying an additional magnetic field $H_b$ in addition to the static magnetic field $H_o$ after the application of the microwave pulses $P_i$ and $P_r$ and for a time during which the spin echo signal is produced. This is shown by reference to the timing diagram shown in FIG. 3.

The application of the additional magnetic field $H_b$ shown in FIG. 3 causes the echo signal to be generated at a slightly higher frequency $f_2$ than the applied pulses of frequency $f_1$. The resonant cavity 32 is designed to have a low Q resonant frequency mode at the frequency $f_2$ so that the spin echo signal will be coupled out of the cavity to the waveguide circuit 30 and to the circulator 28. By coupling an additional waveguide circuit 42 to another port of the circulator 28, the spin echo signal is converted into an IF signal by means of a local oscillator 44 and a mixer 46. The IF output of the mixer is then fed to a detector 48 which then couples a video signal suitable for observation by means of an indicator which may be, for example, an oscilloscope or an oscillograph.

The frequency shift in the spin echo signal can be explained by reference to the following relationship:

$$h\nu = g\beta H$$

where h is Plank's constant, $\nu$ is the frequency of the absorption line corresponding to the Larmor frequency, g is a constant dependent upon the orientation of an anisotropic sample in the magnetic field, $\beta$ is the Bohr magnetron and H is the field strength of the magnetic field. It can be seen then that an incremental increase in the term H will result in an increase in the term $\nu$.

This can further be explained by reference to FIG. 5 which is a diagram illustrative of the Zeeman splitting of the electron spins having the populations $\rho_1$ and $\rho_2$. In absence of a magnetic field H, no splitting of the electron spins occurred; however, as a magnetic field is applied, the populations $\rho_1$ and $\rho_2$ become further separated indicative of increased population of a relatively lower energy level $\rho_1'$, but with a resulting decrease in the population $\rho_2'$ of a relatively higher energy level than $\rho_2$.

In the instant invention the static magnetic field $H_o$ produces the electron population difference $\rho_1 - \rho_2$ and the Larmor frequency $\nu_1$. The addition of the field $H_b$, however, after the application of the microwave pulses $P_i$ and $P_r$ increases the Larmor frequency to $\nu_2$.

Since the echo signal is increased in frequency from the input frequency $f_1$ to $f_2$ the cavity 32 permits isolation between the input pulses and the spin echo output which when superheterodyne detection is utilized such as shown in the embodiment in FIG. 1, the local oscillator 44 can be adjusted such that the echo signal provided at the output of the detector 48 is observed without observing the applied pulses $P_i$ and $P_r$.

Figure 7:
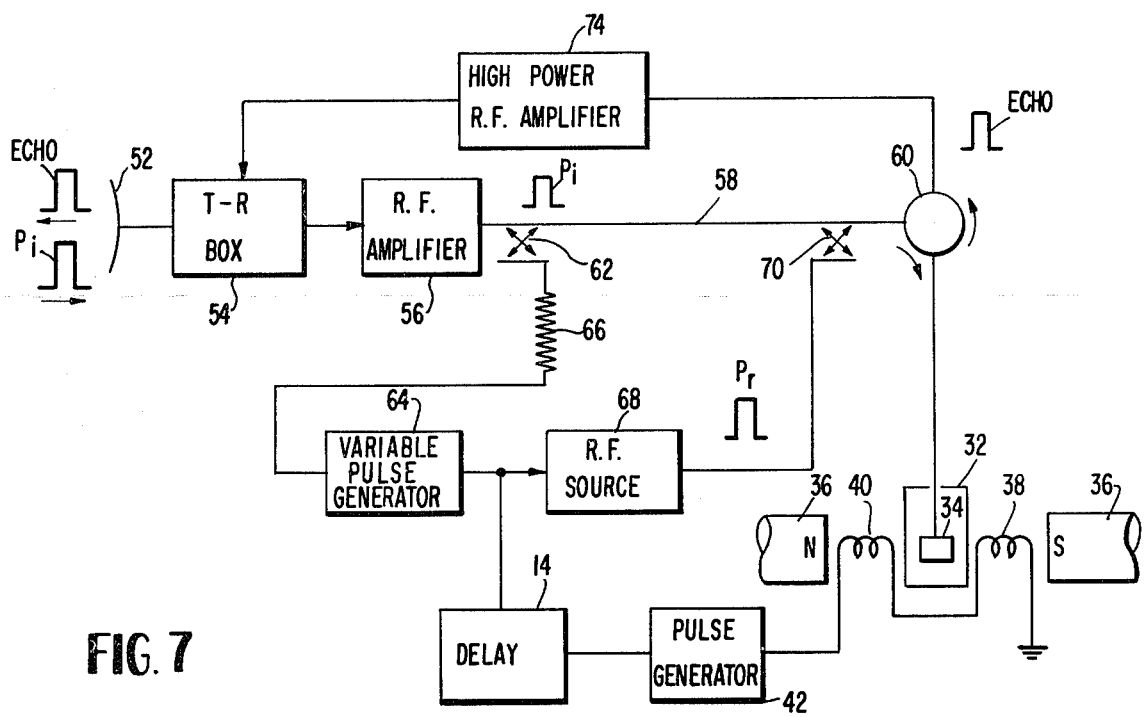
FIG. 7 is a block diagram of a second embodiment of apparatus for practicing the subject invention.

Referring now to a second embodiment of the subject invention which is disclosed in FIG. 7, attention is directed to FIG. 6 which illustrates the principle of Doppler radar which is capable of measuring the speed of a moving vehicle or target by measuring the Doppler shift of the returned or reflected radar signal therefrom. FIG. 6(a) discloses vehicle A transmitting a pulse of microwave energy having a carrier frequency of $f_1$ to vehicle B which is moving toward vehicle A at a velocity v. Illustration 6(b) discloses that the microwave pulse radiated from vehicle A is incident upon vehicle B. Illustration 6(c) indicates that the incident pulse has been reflected from vehicle B toward the sending vehicle A; however, the reflected pulse is broadened in time due to the physical dimensions of vehicle B and is shifted in frequency by the amount $\Delta f$ which when received by vehicle A as a signal $f_1 + \Delta f$ as shown in illustration 6(d). The Doppler-shifted pulse provides an indication of the velocity of vehicle B.

The embodiment shown in FIG. 7 discloses radar apparatus utilizing the teachings of the subject invention to provide an electronic countermeasure system for vehicle B to provide vehicle A with erroneous information to its velocity.

Figure 8:
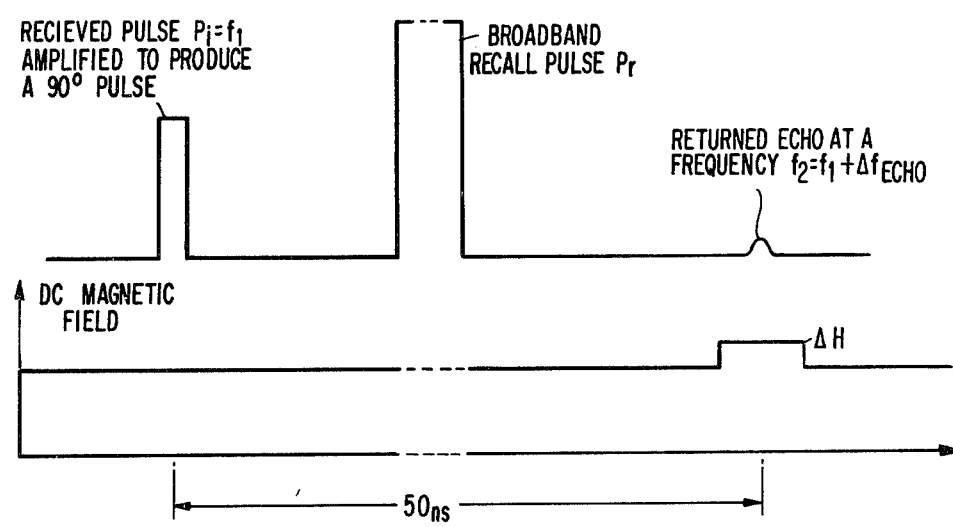
FIG. 8 is a diagram depicting the operation of the embodiment shown in FIG. 7.

The embodiment of FIG. 7 discloses a microwave frequency antenna 52 associated with radar systems and the like. The antenna 52 is coupled to a transmit-receive device 54 commonly referred to as a T-R box whereupon an incident microwave pulse $P_i$ received at the antenna 52 is coupled into a receiver RF amplifier 56. The output of the RF amplifier 56 is coupled to a waveguide circuit 58 which couples into a circulator 60 and a directional coupler 62 in a manner similar to the embodiment shown in FIG. 1. The portion of the pulse $P_1$ coupled into the directional coupler 62 is fed to a variable pulse generator 64 through an attenuator 66. Variable pulse generator 64 generates a trigger which is applied to an RF source 68 of microwave frequencies which produces a microwave pulse $P_r$ which is coupled back into the waveguide 58 by means of the directional coupler 70. The pulse $P_r$ is a broadband "recall" pulse which is separated from the incident microwave pulse $P_i$ by a predetermined time interval. The microwave pulses $P_i$ and $P_r$ in the waveguide 58 comprise the 90° and 180° pulses of a spin echo system which when applied to a cavity resonator 32 by means of the circulator 60 and the waveguide 72 will produce a spin echo signal in the sample 34 in the presence of a static magnetic field provided by the magnet 36 as disclosed above. The resonant cavity 32 is adapted to be a dual resonant frequency mode cavity as explained with reference to the embodiment shown in FIG. 1. The electromagnet coils 38 and 40 are coupled to and energized by means of a pulse generator 42 which is controlled from a time delay circuit 14 which is operated in synchronism with the output of the variable pulse generator 64. The electromagnet coils 38 and 40 produce an additional incremental magnetic field $H_b$ in addition to the static magnetic field $H_o$ produced by the permanent magnet 36 after the application of the pulses $P_i$ and $P_r$ to shift the frequency of the echo signal to $f_2$ as shown in FIG. 8. The echo signal shifted in frequency by an amount $\Delta f_{echo}$ from $f_1$ is coupled out of the cavity 32 back to the circulator whereupon it is fed to a high power RF amplifier 74 which may be for example a traveling wave tube device. The high power RF amplifier 74 is coupled back to the transmit-receive apparatus 54 where it is coupled to the antenna 52 for reradiation back to the source of the incident pulse $P_i$ at a frequency $f_2 = f_1 \pm \Delta f_{echo}$.

Figure 9:
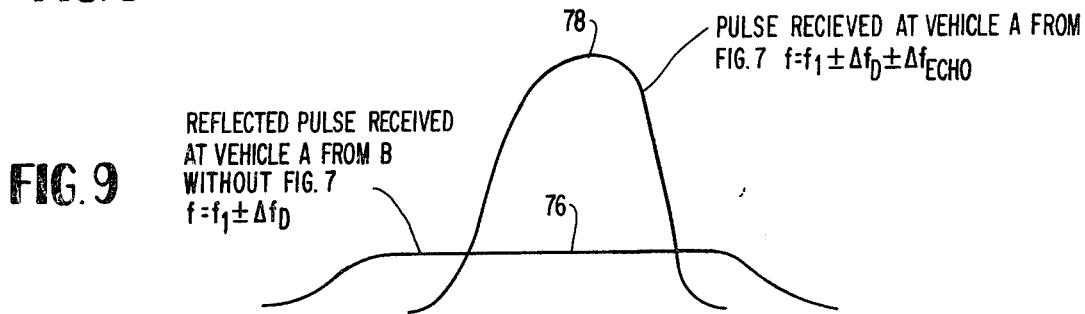
FIG. 9 is a diagram illustrative of the spin echo signal transmitted from apparatus such as shown in FIG. 7 as compared to the input signal.

FIG. 9 is representative of the ability of the apparatus shown in FIG. 7 to distort an interrogating radar signal having a carrier frequency of $f_1$. Waveform 76 for example is illustrative of a relected pulse from vehicle B which is received at vehicle A in absence of the apparatus shown in FIG. 7 on vehicle B. The signal content of waveform 76 is the carrier frequency $f_1 \pm f_D$ (Doppler shift). Waveform 78 of FIG. 9 on the other hand is illustrative of a pulse received at vehicle A from vehicle B which includes apparatus as shown in FIG. 7 wherein a portion of the radiated pulse from vehicle A is captured and a spin echo signal is generated therefrom and reradiated back to vehicle A which includes not only the Doppler shift, but also the shift in frequency of the echo signal produced in accordance with the subject invention, i.e., $f_1 \pm f_D \pm \Delta f_{echo}$. The echo signal received by vehicle A will be a coherent signal with respect to the initial pulse radiated by vehicle A and will therefore be indistinguishable therefrom by correlation techniques. The apparatus disclosed in FIG. 7, therefore, discloses an electronic counter-measure system which may be used not only as a jammer, but also as a decoy.

While the present invention has been shown and described with respect to embodiments which provide satisfactory results, the detailed specification is not meant to be interpreted in a limited sense since all equivalents, modifications and alterations coming within the spirit and scope of the invention are herein meant to be included. For example in all instances where the static magnetic field is increased during the time of the echo in order to increase the echo frequency, the field might also be decreased to effect a decrease in echo frequency.

We claim as our invention:

1. An electron spin echo system comprising in combination:
   a resonant cavity having a paramagnetic spin echo sample located therein and having a first and a second resonant frequency in a predetermined frequency range of selected Larmor frequencies of said spin echo sample, said cavity being further characterized by having a relatively high Q for said first resonant frequency and having a relatively low Q for said second resonant frequency;
   means for supplying a static unidirectional magnetic field through said spin echo sample;
   means for generating first and second RF pulses separated by a predetermined time interval;
   means for coupling said first and said second RF pulses into said resonant cavity;
   means for changing the magnitude of the unidirectional magnetic field through said spin echo sample after the application of said first and said second Rf pulses and during the time a spin echo signal is generated whereby the spin echo signal is shifted in frequency to said second resonant frequency of said cavity; and
   means for coupling said spin echo signal out of said cavity at said second resonant frequency.

2. The invention as defined by claim 1 wherein said first resonant frequency comprises a lower frequency than said second resonant frequency and the change of the magnitude of the unidirectional magnetic field comprises an increase of the magnetic field to effect an upward shift in the spin echo frequency.

3. The invention as defined by claim 2 wherein said means for increasing the unidirectional magnetic field comprises means which generates a magnetic field pulse applied in addition to said static magnetic field.

4. The invention as defined by claim 3 wherein said means which generates said magnetic field pulse includes electromagnetic coil means located adjacent said resonant cavity and pulse generator means for generating an additional magnetic field parallel to said unidirectional magnetic field coupled to said coil means for energizing said coil means for a predetermined time after said first and second RF pulses are coupled to said resonant cavity.

5. The invention as defined by claim 1 and additionally including a timing circuit, and another RF generator coupled to said timing means for producing said first RF pulse, and wherein said means for increasing the unidirectional magnetic field is coupled to said timing circuit and produces a magnetic field pulse in aiding relationship to said static unidirectional magnetic field in timed relationship to the first and second RF pulses.

6. The invention as defined by claim 1 wherein said resonant cavity comprises a cylindrical cavity.

7. The invention as defined by claim 1 and additionally including:

means for receiving said first RF pulse from an external source; and means coupled to said resonant cavity for transmitting said pulse echo signal back toward said external source.

8. The invention as defined by claim 7 wherein said means for receiving said first RF pulse comprises:

antenna means for receiving RF signals; and circuit means coupling said antenna means to said means for coupling said first and second RF pulse into said resonant cavity.

9. The method of shifting the frequency of a spin echo signal from the frequency of an input pulse and a recall pulse comprising the steps of:

applying a unidirectional magnetic field through a resonant cavity having a paramagnetic spin echo sample located therein;

coupling said input pulse and said recall pulse into said cavity for generating a spin echo signal; and increasing the unidirectional magnetic field through said spin echo sample after the application of the input and recall pulses and during the time in which said spin echo signal is produced.

* * * * *